United States Patent
Nagai et al.

(10) Patent No.: US 6,855,952 B2
(45) Date of Patent: *Feb. 15, 2005

(54) SEMICONDUCTOR DEVICE AND SEMICONDUCTOR PACKAGE

(75) Inventors: Akira Nagai, Hitachi (JP); Satoru Amou, Hitachi (JP); Shinji Yamada, Tsukuba (JP); Takao Ishikawa, Hitachi (JP); Hiroshi Nakano, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/400,647

(22) Filed: Mar. 28, 2003

(65) Prior Publication Data

US 2004/0038021 A1 Feb. 26, 2004

(30) Foreign Application Priority Data

Aug. 26, 2002 (JP) ........................................ 2002-244516

(51) Int. Cl.$^7$ ........................... B32B 27/00; H01L 35/24
(52) U.S. Cl. ........................ 257/40; 428/620; 428/308.4; 428/318.6; 428/319.3; 428/319.9; 428/500; 428/521; 524/575; 524/423
(58) Field of Search ........................... 524/575, 423; 257/40; 428/620, 308.4, 318.6, 319.3, 319.9, 500, 521

(56) References Cited

U.S. PATENT DOCUMENTS

| | | | |
|---|---|---|---|
| 5,475,264 A | * | 12/1995 | Sudo et al. ................. 257/723 |
| 6,420,476 B1 | * | 7/2002 | Yamada et al. ............. 524/575 |
| 2004/0039127 A1 | * | 2/2004 | Amou et al. .............. 525/328.9 |

FOREIGN PATENT DOCUMENTS

| | | | |
|---|---|---|---|
| JP | 11-60519 | 3/1999 | |
| JP | 2002-9202 A | * 1/2002 | ........... H01L/23/14 |

OTHER PUBLICATIONS

Prior U.S. Appl. No. 09/951,414, filed Sep. 14, 2001 (Title of the invention: Low Dielectric Loss Tangent Resin Composition, Curable Film and Cured Product, Electrical Part Using the Same and Method for Production Thereof.
"Soluble poly(divinylbenzene): Reaction Mechanism for the Anionic Polymerization of Divinylbenzene with Lithium Diisopropylamide as Catalyst" Makromo.Chem 187,23–37 (1986).
High–Yield Synthesis and Characterization of 1,2–Bis(p–vinylphenyl) Ethane, Li et al., J. Polym.Sci.Part A: Polym. Chem.32,2023–2027(1994).
"Cyclopolymerization of _–BIS (4–Vinylphenyl)–Alkane: Polymer Containing [3.3] Paracyclophane Unit in the Main Chain" Polymer Letters Edition, vol. 14, pp. 85–90 (1976).

* cited by examiner

*Primary Examiner*—Deborah Jones
*Assistant Examiner*—Ling Xu
(74) *Attorney, Agent, or Firm*—Antonelli, Terry, Stout & Kraus, LLP

(57) ABSTRACT

A semiconductor device wherein a resin containing as a cross-linking component a compound having a plurality of styrene group and represented by chemical formula [1] is used as an insulating material:

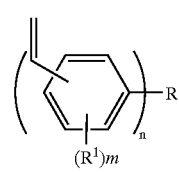

[1]

where R is a hydrocarbon structure which may have a substituent group or groups, $R^1$ is hydrogen, methyl, or ethyl, m is and integer of 1 to 4, and n is an integer of not less than 2. With this, a semiconductor device and a semiconductor package which show excellent transmission characteristics and less power consumption are provided.

16 Claims, 4 Drawing Sheets

SEMICONDUCTOR DEVICE AND SEMICONDUCTOR PACKAGE

BACKGROUND OF THE INVENTION

The present invention relates to a semiconductor device and to a semiconductor package, in which an insulating material having a low dielectric constant and a low dielectric dissipation factor is used.

As the speed, degree of integration, and frequency of operation of LSIs have increased, an increase in the signal delay time due to an increase in the wiring capacity has become a problem. While a silicon oxide ($SiO_2$) layer having a dielectric constant of about 4.2 has hitherto been used as an interlayer insulating layer in such devices, a material having a much lower dielectric constant and a much lower dielectric dissipation factor is needed in order to enhance the operating speed of the devices. Examples of a low dielectric constant layer that has been put to practical use at present include a SiOF layer having a dielectric constant of about 3.5. In addition, examples of an insulating layer having an even lower dielectric constant include an organic SOG (spin on glass) layer having a specific inductive capacity of 2.5 to 3.0. However, the characteristics required of the interlayer insulating layer in LSIs include not only a low specific inductive capacity, but also a good heat resistance and high mechanical strength.

In a multi-layer wiring process for an LSI which is miniaturized, the use of CMP (chemical mechanical polishing) as a planarizing technique is indispensable, and, therefore, the mechanical strength of the LSI is an important factor. The organic SOG having a low dielectric constant has the problem that it has a lower mechanical strength than the conventional $SiO_2$ and SiOF layers. In view of this, organic polymer systems having a lower dielectric constant than inorganic insulating layers have been investigated. Among these, polyimide resins have been widely studied since they are highly planar. The polyimide resins, however, have the problem that they have a higher dielectric constant and moisture absorption factor among organic polymers, and, therefore, they are applied to a limited extent to some semiconductor devices, such as bipolar ICs, from the viewpoint of reliability.

Also, in semiconductor packages and in wafer-level packages, in which a package function is formed by a technique involving the extension of the wiring forming process in semiconductor devices, a material having a low dielectric constant and a low dielectric dissipation factor is keenly demanded as an insulating material for a rewiring layer, which is the outermost layer. This is because an increase in the signal delay time due to an increase in the wiring capacity has come to be a problem, as the speed, degree of integration, and frequency have been increased, also in these technical areas. As an insulating material meeting such demands, polyimide resins have been widely used, as in the foregoing. The polyimide resins, however, have the problem that they have a higher dielectric constant and moisture absorption factor among organic polymers.

Furthermore, not only on the wafer level package but also on the basis of general chip-scale packages composed of cut pieces, a material having a low dielectric constant and a low dielectric dissipation factor is keenly demanded as an insulating material to be used in the areas surrounding a wiring layer, from the same viewpoint as indicated above.

SUMMARY OF THE INVENTION

An object of the present invention is to provide an insulating material having a low dielectric constant, a low dielectric loss and a low moisture absorption, as well as a high heat resistance, which is applicable to an interlayer insulating layer in a semiconductor device and to an insulating material in the areas surrounding a wiring layer in a semiconductor package.

According to one aspect of the present invention, there is provided a semiconductor device wherein a resin containing, as a cross-linking component, a compound having a plurality of styrene groups and represented by chemical formula [1] is used as an insulating material:

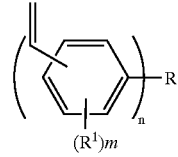

[1]

where R is a hydrocarbon structure which may have a substituent group or groups, $R^1$ is hydrogen, methyl, or ethyl, m is an integer of 1 to 4, and n is an integer of not less than 2.

In addition, the insulating material has further desirable characteristics when it has a dielectric constant of not more than 3.0 and a dielectric dissipation factor of not more than 0.005 (as measured at a frequency of 1 GHz).

With regard to the interlayer insulating layer in a semiconductor device, CMP (chemical mechanical polishing) is indispensable as a planarizing technique in a multi-layer wiring process for miniaturized LSIs, and, therefore, mechanical strength is an important factor. The resin containing, as a cross-linking component, a compound having a plurality of styrene groups, according to the present invention, has a glass transition temperature of around 200° C., so that the resin has a high modulus of elasticity and a sufficient mechanical strength in the vicinity of room temperature at which the CMP process is carried out. In addition, since the compound has few polar groups, as represented by the chemical formula, the resin has the excellent characteristic of low moisture absorption. Therefore, for the CMP process, the resin is advantageous as compared with polyimide and porous materials which have hitherto been investigated.

Besides, before the curing reaction, the compound represented by chemical formula [1] is in a liquid state, or has a melting point of not more than 100° C.; therefore, the interlayer insulating layer can be formed by a solventless or solution spin coating method. Typical examples of the compound of chemical formula [1] include 1,2-bis (vinylphenyl)ethane, 1,3-bis(vinylphenyl)propane, 1,2-bis (vinylphenyl)propane, 1,1-bis(vinylphenyl)propane, 1,4-bis (vinylphenyl)butane, 1,3-bis(vinylphenyl)butane, 1,2-bis (vinylphenyl)butane, 2,3-bis(vinylphenyl) butane, 1,2-bis (vinyl(methyl)phenyl)ethane, 1,2-bis(vinyl(ethyl)phenyl) ethane, 1-(vinyl(methyl)phenyl)-2-(vinylphenyl)ethane, and 1,2,3-tri(vinylphenyl)propane, which are not limitative. The solvent to be used here is not particularly limited, so long as the compound of chemical formula [1] is soluble in the solvent. Examples of the solvent include ketones, such as acetone, methyl ethyl ketone or methyl isobutyl ketone, aromatic hydrocarbons, such as toluene or xylene, amides, such as N,N-dimethylformamide or N,N-dimethylacetamide, ethers, such as diethyl ether, ethylene glycol monomethyl ether, propylene glycol monomethyl ether, tetrahydrofuran or dioxane, and alcohols, such as methanol, ethanol or isopropanel, which are not limitative.

These organic solvents may be used either singly or in a combination of two or more of them.

A varnish for spin coating may use the compound of chemical formula [1] not only singly, but also in combination with other components. Examples of the other components include polyquinoline, polybutadiene, polyisobutyrene, polystyrene, polymethylstyrene, polyethylstyrene, polydivinylbenzene, polyarylic acid esters (e.g., polymethyl acrylate, polybutyl acrylate, and polyphenyl acrylate), polyacrylonitrile, poly-N-phenylmaleimide, poly-N-vinylphenylmaleimide, and polyphenylene oxide, which are not limitative. The compound of chemical formula [1] can thus be combined with another component or components for improving various characteristics. Among these, the combinations with polyphenylene oxide, polybutadiene, polyquinoline or the like are effective in enhancing the mechanical strength, breaking extension, adhesive properties or the like.

BRIEF DESCRIPTION OF THE DRAWINGS

Other objects and advantages of the invention will become apparent from the following description of various embodiments, with reference to the accompanying drawings, in which.

DETAILED DESCRIPTION OF THE PREFERRED EMBODIMENTS

Preferred embodiments of the present invention will be described below.

First, an embodiment of the invention, in which a resin containing, as a cross-linking component, a compound having a plurality of styrene groups, which is represented by chemical formula [1], is used as an interlayer insulating layer in a semiconductor device, will be described in more detail with reference to FIG. 1.

Figure 1:
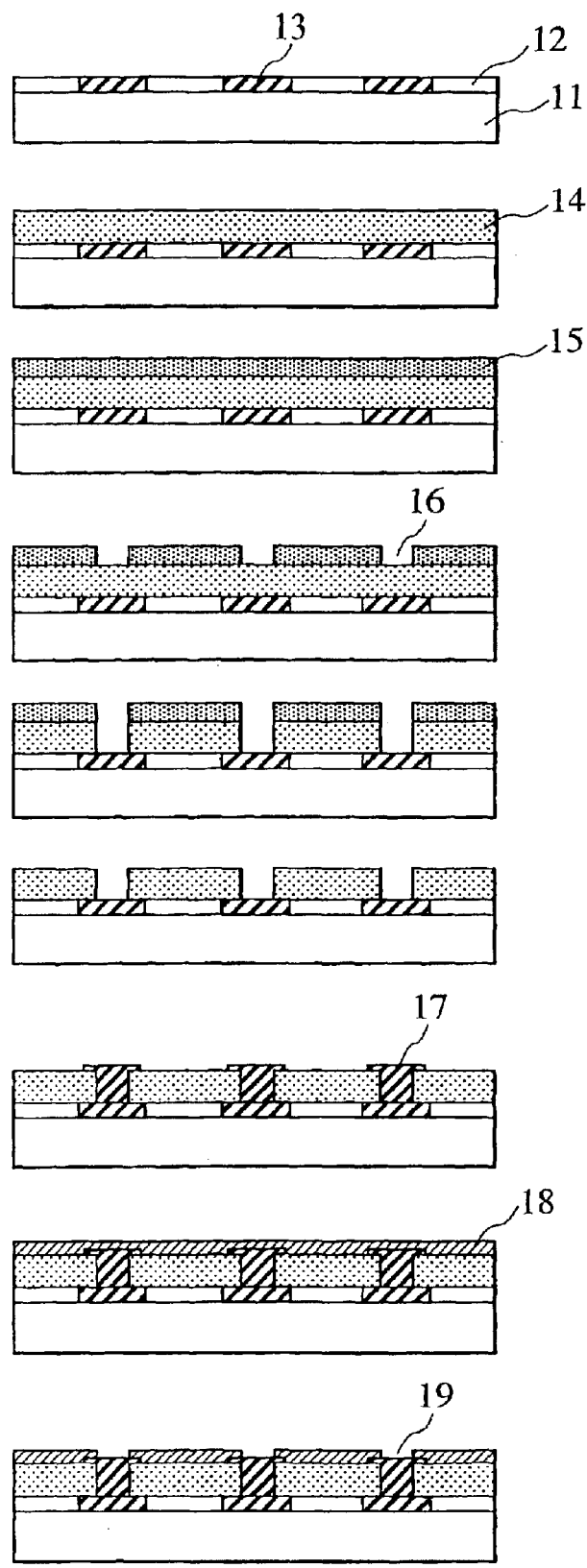
FIG. 1 is a sectional view illustrating successive steps in a production process in the manufacture of a multi-layer wiring structure in a semiconductor device according to one embodiment of the present invention.

FIG. 1 shows one example of a production process in the manufacture of a multi-layer wiring structure in a semiconductor device. In FIG. 1, a semiconductor device substrate 11, such as a silicon substrate or glass substrate provided with circuit devices, is covered with a protective layer 12, exclusive of predetermined portions thereof, and a first conductor layer 13 is formed on the exposed portions. A silicon oxide layer is generally used as the protective layer 12 in many cases. A resin containing the compound of chemical formula [1] according to the present invention may also be used as the protective layer. In a material of a first conductor layer, copper is most excellent as a low-resistance material. Next, the resin containing the compound of chemical formula [1] according to the present invention is applied as an interlayer insulating layer by a spin coater, potting or the like. Then, drying, removal of solvent, a thermal reaction treatment are conducted as required, to form the interlayer insulating layer 14 having a low dielectric constant and a low dielectric dissipation factor.

Next, a layer of a photosensitive resin 15, based on, for example, chlorinated rubber or phenolic novolac, is formed on the interlayer insulating layer 14 by spin coating, and windows 16 are formed in the layer of the photosensitive resin 15 by etching, so that predetermined areas of the interlayer insulating layer 14 are exposed. The portions of the interlayer insulating layer 14 that are exposed via the windows 16 are selectively etched by a dry etching method using a gas such as oxygen or carbon tetrafluoride, to expose the conductor layer 13. Finally, the photosensitive resin 15 is removed by use of an etchant that is capable of removing only the photosensitive resin 15, without etching the exposed conductor layer 13, for example, n-butyl acetate or the like. Further, a second conductor layer 17 is is formed by a known metal forming technique, such as plating or sputter vapor deposition, and it is electrically connected to the first conductor 13.

Where a three or more-layer multi-layer wiring structure is to be formed, the object can be attained by repeating the above-mentioned steps. More specifically, the step of forming an interlayer insulating layer as an insulation layer on a conductor layer, the step of selectively removing predetermined locations of the interlayer insulating layer to partially expose the conductor layer beneath the interlayer insulating layer, and the step of forming a new conductor layer in electrical connection with the exposed portions of the conductor layer, are repeated.

Finally, a surface protective layer 18 is applied to the uppermost portion of the multi-layer wiring structure, and windows 19 are formed at predetermined portions thereof by the same method as described above. With provision of the surface protective layer, the inside of the semiconductor device can be protected from moisture, foreign matter and the like coming from the exterior. Also, the resin containing the compound of chemical formula [1], which has a low moisture absorption characteristic, can be used as the surface protective layer. Where the protective layer 12, the interlayer insulating layer 14, and the surface protective layer 18, which are insulating layers in the semiconductor device, are all formed by use of the resins containing the compound of chemical formula [1], it can be expected that the same-based materials show excellent interface adhesion properties, which is advantageous from the viewpoint of reliability. In addition, where the resin containing the compound of chemical formula [1] has a photosensitive property, the step of the photosensitive resin 15 can be omitted, which promises a large reduction in cost. Examples of the technique for imparting is the photosensitive property to the resin containing the compound of chemical formula [1] include the following. Patterning can be enabled by varying the solvent solubility by irradiation with light. In addition, examples of the method for enhancing insolubility include a method of introducing a photo-crosslinking functional group into the molecular structure. Specific examples of such a functional group include acryl group, allyl group, glycidyl group, cinnamoyl group, etc. On the contrary, examples of the method for enhancing solubility include a method of introducing naphthoquinone diazide, and a method of introducing a group capable of forming a carboxylic acid upon photo-reaction. These may be used either in copolymerization with the compound [1] or in a blend or mixture with the compound [1], in such a range as to not impair the objective dielectric characteristics.

Figure 2:
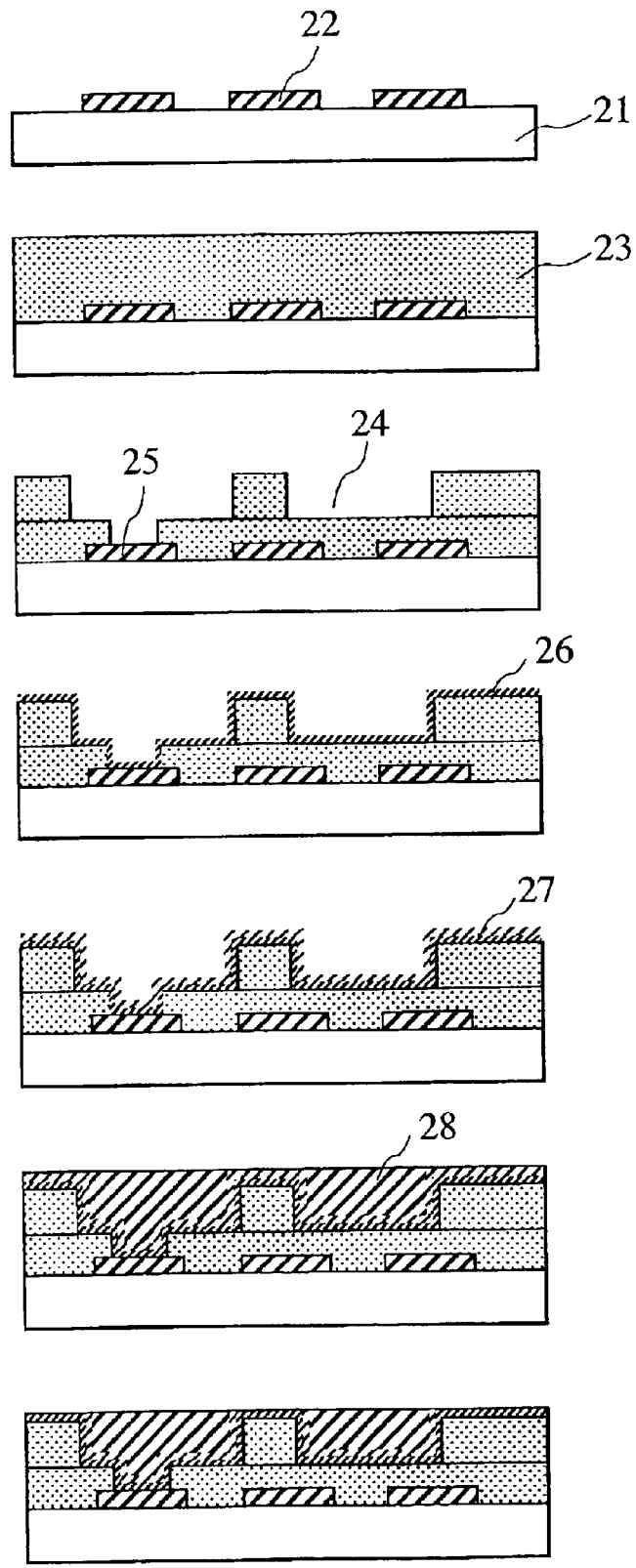
FIG. 2 is a sectional view illustrating successive steps in a production process in the manufacture of a multi-layer structure in a semiconductor device according to another embodiment of the present invention.

Next, one example of another production process for the manufacture of a multi-layer wiring structure in a semiconductor device will be described below with reference to FIG. 2. A lower wiring 22 is formed on a silicon substrate 21, and a resin containing the compound of chemical formula [1] according to the present invention is applied thereto as an interlayer insulating layer by a spin coater, potting or the like. Then, drying, removal of solvent, a thermal reaction treatment are carried out as required, to form the interlayer insulating layer 23 having a low dielectric constant and a low dielectric loss.

Thereafter, a groove 24 and a connection hole 25 for wiring are formed by a dry etching method. Next, a layer of Ta is formed to a thickness of 50 nm as a barrier layer 26 by a sputtering method. Subsequently, a layer of copper is formed to a thickness of 150 nm as a seed layer 27. The copper seed layer 27 is formed at a layer growth rate of 200 to 400 nm/min, by use of, e.g., a copper sputtering long-span sputtering apparatus CERAUSZX-100 (a product by ULVAC, Inc.). The substrate is immersed in a plating solution having a formulation as set forth below, and electroplating is conducted at a liquid temperature of 24° C. and a current density of 1 A/dm$^3$ for 5 min, to fill up the wiring groove 24 and the connection hole 25 with copper, thereby forming a copper wiring 28. The anode used is formed of phosphorus-containing copper.

| | |
|---|---|
| Copper sulfate | 0.4 mol/dm$^3$ |
| Sulfuric acid | 2.0 mol/dm$^3$ |
| Chloride ion | $1.5 \times 10^{-3}$ mol/dm$^3$ |
| MICROFAB CU2100 | $10 \times 10^{-3}$ mol/dm$^3$ |

(MICROFAB CU2100 is an additive for copper plating, a product by Electroplating Engineers of Japan Ltd.)

Next, chemical mechanical polishing (CMP) is conducted. The CMP process is conducted on, e.g., a Type 472 chemical mechanical polishing apparatus (a product by SpeedFam-IPEC, Inc.) by use of alumina dispersed abrasive grains containing 1–2% of hydrogen peroxide and a pad IC-1000 (a product by Rodel, Inc.) The polishing pressure is 190 G/cm$^2$. The polishing is advanced down to the barrier layer 26, to form the copper wiring 28 in which the wiring conductors are separated. Subsequently, the assembly is cleaned in 5 wt % sulfuric acid for 1 min, and it is further washed in pure water for 1 min.

Subsequently, the above steps are repeated, to thereby form a multi-layer wiring structure. The interlayer insulating layer formed by use of the resin containing the compound of chemical formula [1] according to the present invention has high-mechanical strength and low-moisture absorption, and, therefore, it showed sufficient durability to the CMP step.

Figure 3:
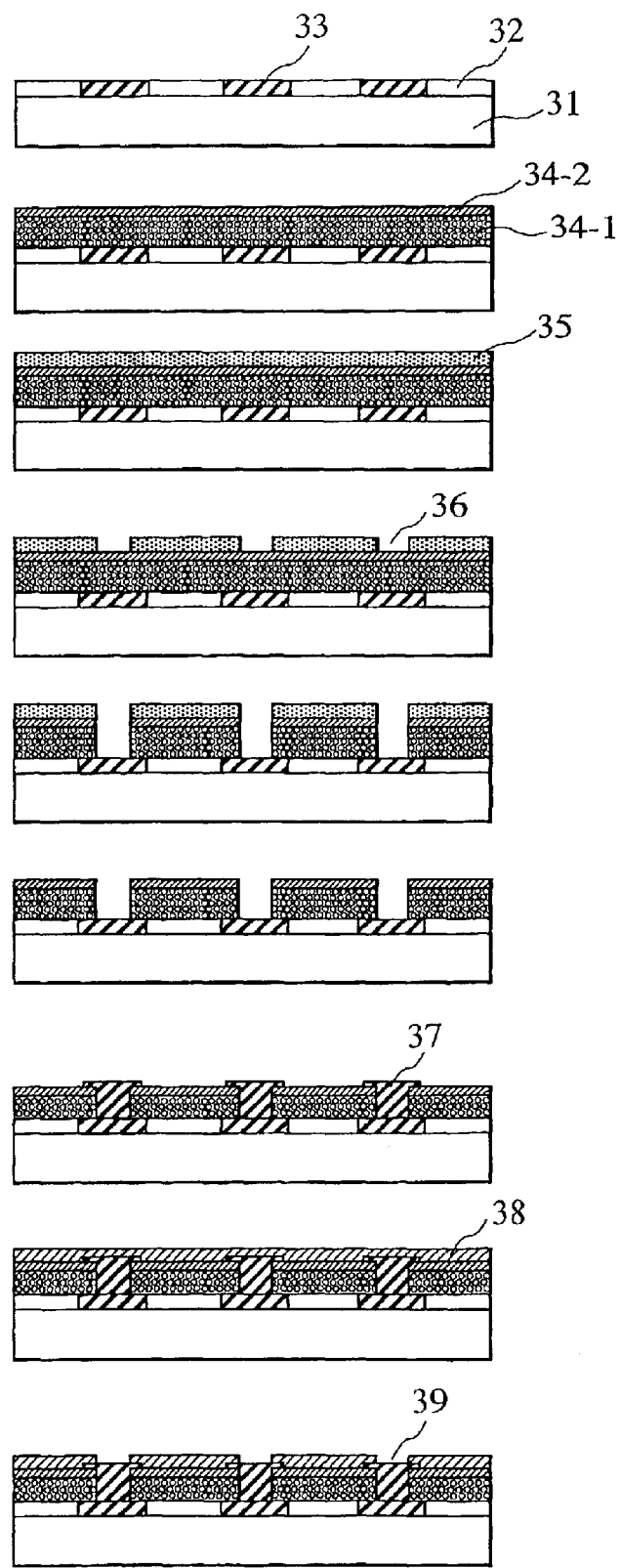
FIG. 3 is a sectional view illustrating successive steps in a production process in the manufacture of a multi-layer structure in a semiconductor device according to still another embodiment of the present invention.

Next, another embodiment in which the interlayer insulating layer in the semiconductor device has a multi-layer structure, composed of a porous structure and a non-porous structure will be described below with reference to FIG. 3.

A first conductor layer 33 and a protective layer 32 are formed on a semiconductor device substrate 31. A layer of a varnish composed of 1,2-bis(vinylphenyl)ethane, an example of the compound [1], blended with polyethylene oxide as a low pyrolysis point polymer is formed thereon by spin coating, and it is subjected to a heating treatment at 350° C. to pyrolyze the polyethylene oxide portions, thereby forming a porous interlayer insulating layer 34-1 in the layer. Further, a varnish consisting only of 1,2-bis(vinylphenyl) ethane is applied by spin coating, to form a non-porous insulating interlayer 34-2, thereby obtaining a interlayer insulating layer.

Then, the same steps as shown in FIG. 1 are conducted, to obtain a semiconductor device according to the present invention. Where the interlayer insulating layer is made to have a porous structure, as in this embodiment, it is possible to obtain an insulation layer with a much lower dielectric constant. In addition, where the moisture absorption property constitutes a problem, the portions where the moisture absorption property is the problem may be made to have a non-porous structure and the other portions may be made to have a porous structure, whereby an interlayer insulating layer having a low dielectric constant and a low moisture absorption can be obtained.

Known general techniques can be used as the method for forming a porous layer. Examples of such techniques include: a method utilizing micro phase separation; an extraction method of forming a layer by adding an additive and thereafter removing the additive by extraction; a melting and rapid cooling method utilizing solidification through rapid cooling from high temperatures; a stretching method using micro-fibrilation by uniaxial stretching or biaxial orientation; an electron beam irradiation etching method of forming uniform cylindrical pores by etching; a water vapor sintering method of press molding a ultrahigh molecular weight polymer; a freeze drying method of removing a solvent from a polymer solution by freeze drying; a boring method of mechanically boring minute pores in the surface of a layer by irradiation with plasma or the like; a micro-gel method of connecting micro-gels with a polymer phase; a supercritical method of mixing a supercritical fluid and thereafter degassing to form pores; a foaming agent method of adding a foaming agent to form a porous layer; a pyrolysis method of copolymerizing a low pyrolysis point polymer and then heating it to form bubbles; and a method utilizing a poor solvent extraction. As for the method of forming a porous interlayer insulating layer, where a varnish is applied by a spin coater, potting or the like, it is general practice to treat the layer to make it porous after the layer is formed. Effective examples of the technique to be used in this instance include electron beam irradiation etching, plasma irradiation boring, a foaming agent method, and a pyrolysis method. In addition, it is also possible to treat a layer to make it porous and then apply the porous layer to obtain a porous interlayer insulating layer.

Figure 4A:
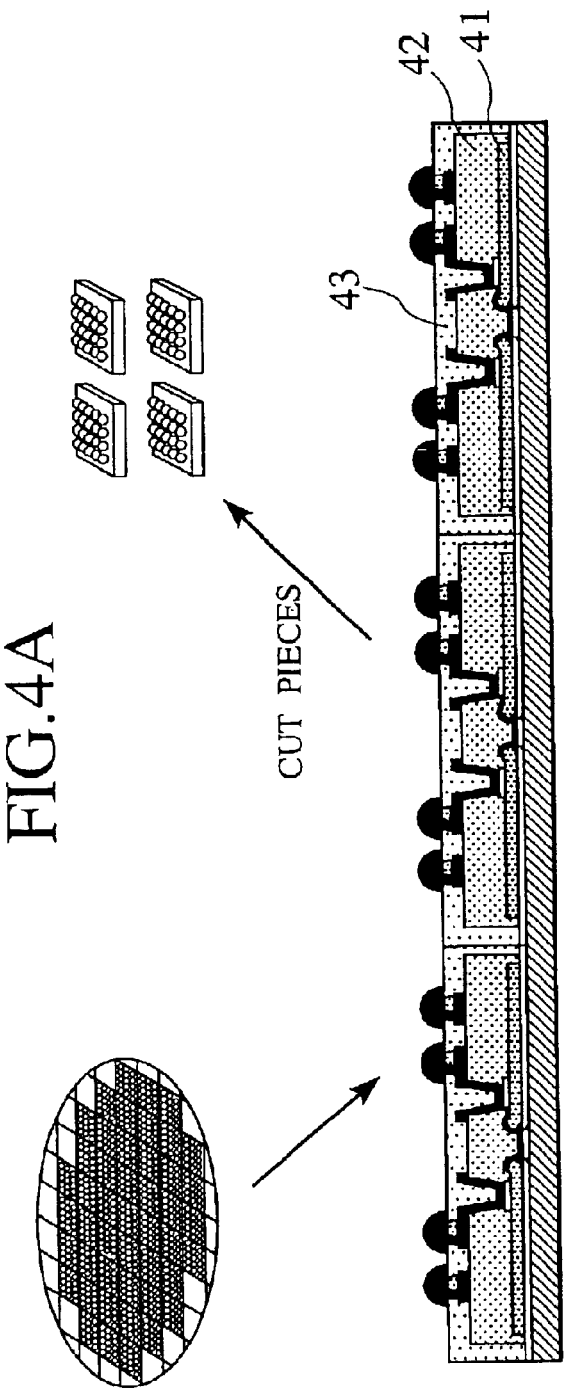
FIGS. 4A and 4B are sectional views of a wafer-level package and a chip-scale package, respectively.

The insulating material comprised of the resin containing the compound of chemical formula [1] described above can not only exhibit the above-mentioned effect when applied to the interlayer insulating layer in a semiconductor device, but also exhibit the same effect when applied to a wafer-level package material, which is an insulating material disposed on the same wafer. Basically, by forming a re-wiring layer by the same process as in shown FIG. 1 on a wafer provided with semiconductor devices, it is possible to obtain a wafer-level package as shown in FIG. 4A. In this case, the protective layer 12 in FIG. 1 corresponds to a chip protective layer 41 in the package shown in FIG. 4A, the interlayer insulating layer 14 in FIG. 2 corresponds to an insulating interlayer 42 shown in FIG. 4A, and the surface protective layer 18 in FIG. 1 corresponds to a wiring protective layer 43 shown in FIG. 4A. In such a wafer-level package, the packaging step is all finished in the wafer size, and final separation to cut the wafer in pieces is conducted to obtain individual packages, so that the end faces of the chips and the end faces constituting the insulation layer and the rewiring layer are formed of the same faces because they are formed by cutting.

In contrast to the wiring inside the semiconductor, in the re-wiring of the wafer-level package, the interlayer insulating layer may be lowered in modulus of elasticity to obtain a stress relaxation layer, whereby it is possible to cause the layer to have the function of reducing the thermal stress generated due to the difference in thermal expansion coefficient between the semiconductor device (silicon) and the substrate (glass-epoxy) at the time of mounting the package onto the substrate. With this, it can be expected that the connection reliability at the time of mounting the substrate onto the substrate is largely enhanced.

Examples of a means for lowering the modulus of elasticity of the insulating interlayer include the following techniques. Firstly, this object can be attained by a chip-scale semiconductor package wherein a resin containing, as a cross-linking component, a compound having a plurality of styrene groups, as represented by chemical formula [2], is used for forming an insulating interlayer

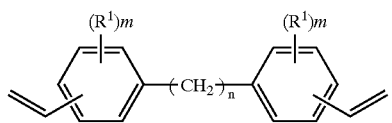

[2]

where $R^1$ is hydrogen, methyl or ethyl, m is an integer of 1 to 4, and n is an integer of 2 to 10. Secondly, the object can be attained by a chip-scale semiconductor package, wherein a phase separation structure, which is composed of a combination of a resin containing, as a cross-linking component, a compound having a plurality of styrene groups and represented by chemical formula [1] with an elastomer component, is used for forming an insulating interlayer:

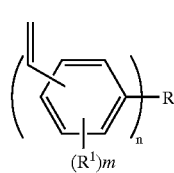

[1]

where R is a hydrocarbon structure, which may have a substituent group or groups, $R^1$ is hydrogen, methyl, or ethyl, m is an integer of 1 to 4, and n is an integer of not less than 2.

Here, when the value of n in chemical formula [2] is increased, the distance between the crosslinkage points in the cured product is elongated, and crosslinkage density is lowered, so that the product has a low modulus of elasticity. Typical examples of the compound of chemical formula [2] include 1,5-bis(vinylphenyl)pentane, 1,6-bis(vinylphenyl)hexane, 1,7-bis(vinylphenyl)heptane, 1,8-bis(vinylphenyl)octane, 1,9-bis(vinylphenyl)nonane, and 1,10-bis(vinylphenyl)decane, which are not limitative.

By obtaining the phase separation structure by use of a combination of the resin containing the compound of chemical formula [1] as a cross-linking component with an elastomer component, it is possible to lower only the modulus of elasticity, while retaining the characteristics (glass transition temperature, thermal expansion coefficient, and the like) of the matrix resin in the cured product comprised of chemical formula [1]. In this case, the elastomer component is preferably a material having a modulus of elasticity of not more than 1 GPa at room temperature. In addition, the elastomer component is preferably a compound which is not compatible with the compound of chemical formula [1]. Examples of such a compound include siloxane compounds, and fluorine-containing elastomer. Among these, the siloxane compounds are often used.

Figure 4B:

While the wafer-level package is treated on a wafer basis in the stage of production, it is cut into pieces to be treated as chip-scale packages, as shown in FIG. 4B, when actually used as packages. Therefore, the effects of the present invention are not only displayed on the basis of the wafer-level package, but also they are expected on the basis of the chip-scale packages of the same structure, in which the resin containing, as a cross-linking component, the compound of chemical formula [1] is used as the insulating material. Here, the chip-scale package means a package of which the occupying area is equal to or approximate to (up to about 1.1 times) that of the chip and which has such a package structure as to be capable of being actually mounted on a substrate in a high density.

Since the dielectric constant of the insulating material governs the delay time in the transmission characteristics of the wiring, it is preferable that the dielectric constant of the insulating material for the semiconductor device and the package be as low as possible. While the conventional polyimide materials have a dielectric constant of 3 to 4, some of the resins according to the present invention can have a dielectric constant of not more than 3.0. Naturally, the dielectric characteristics vary greatly according to the structure of chemical formula [1], the composition of the additive material used in combination, and the like.

Besides, the dielectric dissipation factor affects the energy loss in the transmission characteristics of the wiring. It is desirable that the dielectric dissipation factor also be as low as possible. General organic materials often have a dielectric dissipation factor of not less than 0.01 at 1 GHz. In contrast, according to the present invention, it is possible to obtain a dielectric dissipation factor of not more than 0.005, by selecting the structure of chemical formula [1], the composition of the additive material used in combination, and the like, as in the case of the dielectric constant. With this, it is possible to obtain a semiconductor device or package which shows little energy loss in a high frequency band.

As has been described above, by use of a resin containing, as a cross-linking component, a compound having a plurality of styrene groups and represented by chemical formula [1], it is possible to obtain the effects of a low dielectric constant and a low dielectric dissipation factor. The transmission delay time of the wiring depends on the wiring resistance and the dielectric constant of the insulating material; therefore, the delay time can be shortened by reducing both the wiring resistance and the dielectric constant of the insulating material. In addition, the dielectric loss depends on the dielectric dissipation factor of the insulating material; therefore, by use of a material having a low dielectric dissipation factor, it is possible to obtain a semiconductor device with less energy loss and low power consumption. Similarly, by using the material according to the present invention for forming an insulation layer in a wafer-level package and a chip-scale package, it is possible to obtain packages with a shorter delay time and less energy loss.

According to the present invention, it is possible to obtain a semiconductor device, and a semiconductor package, which have a low dielectric constant, a low dielectric dissipation factor and low moisture absorption, as well as high heat resistance.

While the invention has been described with reference to its preferred embodiments, it is to be understood that the words which have been used are words of description rather than limitation and that changes within the purview of the appended claims may be made without departing from the true scope and spirit of the invention.

What is claimed is:

1. A semiconductor device wherein a resin containing as a cross-linking component a monomer having a plurality of styrene groups and a melting point of not more than 100° C., and represented by chemical formula [1], is used as an insulating material:

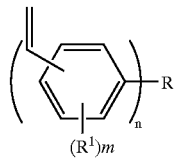

[1]

where R is a hydrocarbon structure which may have a substituent group or groups, $R^1$ is hydrogen, methyl, or ethyl, m is an integer of 1 to 4, and n is an integer of not less than 2.

2. A semiconductor device as set forth in claim 1, wherein said resin has a dielectric constant of not more than 3.0 and a dielectric dissipation factor of not more than 0.005 at a frequency of 1 GHz.

3. A semiconductor device as set forth in claim 1, wherein said resin has a porous structure.

4. A semiconductor device as set forth in claim 1, wherein said resin comprises a multi-layer structure including a first insulating layer having a porous structure and a second insulating layer having a non-porous structure.

5. A semiconductor device as set forth in claim 1, wherein said resin has a glass transition temperature of about 200° C.

6. A semiconductor package wherein a resin containing as a cross-linking component a monomer having a plurality of styrene groups and a melting point of not more than 100° C. and represented by chemical formula [1], is used for forming a re-wiring layer or an insulating interlayer:

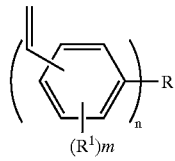

[1]

where R is a hydrocarbon structure which may have a substituent group or groups, $R^1$ is hydrogen, methyl, or ethyl, m is an integer of 1 to 4, and n is an integer of not less than 2.

7. A semiconductor package as set forth in claim 6 wherein said resin has a dielectric constant of not more than 3.0 and a dielectric dissipation factor of not more than 0.005 at a frequency of 1 GHz.

8. A semiconductor package as set forth in claim 6, which is a wafer-level package.

9. A semiconductor package as set forth in claim 6, which is a chip-scale package.

10. A semiconductor package as set forth in claim 6, wherein said re-wiring layer or insulating interlayer is a cured product having a phase separation structure comprised of said resin and an elastomer component.

11. A semiconductor package as set forth in claim 10, wherein the elastomer component has a modulus of elasticity of not more than 1 GPa at room temperature.

12. A semiconductor package as set forth in claim 6, wherein said resin contains as a cross-linking component a compound having a plurality of styrene groups and represented by chemical formula [2]:

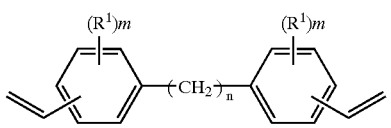

[2]

where $R^1$ is hydrogen, methyl, or ethyl, m is an integer of 1 to 4, and n is an integer of 2 to 10.

13. A semiconductor package as set forth in claim 5 wherein said resin has a glass transition temperature of about 200° C.

14. A semiconductor package wherein a resin containing as a cross-linking agent a monomer having a plurality of styrene groups and a melting point of not more than 100° C., and represented by chemical formula [1] is used for forming a chip protective layer or a wiring protective layer:

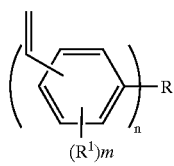

[1]

where R is a hydrocarbon structure which may have a substituent group or groups, $R^1$ is hydrogen, methyl, or ethyl, m is an integer of 1 to 4, and n is an integer of not less than 2.

15. A semiconductor package as set forth in claim 14, wherein said resin has a dielectric constant of not more than 3.0 and a dielectric dissipation factor of not more than 0.005 at a frequency of 1 GHz.

16. A semiconductor package as set forth in claim 14, wherein said resin has a glass transition temperature of about 200° C.

* * * * *